US012424347B2

United States Patent
Jeong et al.

(10) Patent No.: US 12,424,347 B2
(45) Date of Patent: Sep. 23, 2025

(54) STRETCHABLE ACF, METHOD FOR MANUFACTURING SAME, AND INTERFACIAL BONDING MEMBER AND DEVICE COMPRISING SAME

(71) Applicant: POSTECH RESEARCH AND BUSINESS DEVELOPMENT FOUNDATION, Gyeongsangbuk-do (KR)

(72) Inventors: Un Yong Jeong, Gyeongsangbuk-do (KR); Min Sik Kong, Chungcheongbuk-do (KR); Hye Jin Hwang, Busan (KR)

(73) Assignee: POSTECH RESEARCH AND BUSINESS DEVELOPMENT FOUNDATION, Gyeongsangbuk-do (KR)

( * ) Notice: Subject to any disclaimer, the term of this patent is extended or adjusted under 35 U.S.C. 154(b) by 35 days.

(21) Appl. No.: 18/266,253

(22) PCT Filed: Oct. 13, 2021

(86) PCT No.: PCT/KR2021/014069
§ 371 (c)(1),
(2) Date: Jun. 8, 2023

(87) PCT Pub. No.: WO2022/124550
PCT Pub. Date: Jun. 16, 2022

(65) Prior Publication Data
US 2024/0096517 A1    Mar. 21, 2024

(30) Foreign Application Priority Data
Dec. 10, 2020 (KR) .................. 10-2020-0172368

(51) Int. Cl.
| H01B 1/20 | (2006.01) |
| G03F 7/00 | (2006.01) |
| H01B 13/00 | (2006.01) |

(52) U.S. Cl.
CPC ............. *H01B 1/20* (2013.01); *G03F 7/0017* (2013.01); *H01B 13/0016* (2013.01)

(58) Field of Classification Search
CPC ........ H01B 1/20; H01B 1/24; H01B 13/0016; G03F 7/0017
See application file for complete search history.

(56) References Cited

U.S. PATENT DOCUMENTS

| 6,042,894 A * | 3/2000 | Goto ..................... H05K 3/323 427/205 |
| 2008/0020157 A1* | 1/2008 | Larson .................. C09J 179/08 524/495 |
| 2020/0235362 A1 | 7/2020 | Hamamoto et al. | |

FOREIGN PATENT DOCUMENTS

| JP | H04355004 | 12/1992 |
| JP | 2000021236 | 1/2000 |

(Continued)

OTHER PUBLICATIONS

Machine translation of JP2006233203.*

(Continued)

*Primary Examiner* — Haidung D Nguyen
(74) *Attorney, Agent, or Firm* — JCIPRNET

(57) ABSTRACT

The present invention provides a stretchable ACF, a method for manufacturing same, and an interfacial bonding member and a device comprising same. The stretchable ACF comprises: a polymer film; and conductive particles inserted into the polymer film and aligned therein, wherein the conductive particles are exposed to the outside of the upper and lower surfaces of the polymer film.

19 Claims, 15 Drawing Sheets

(56) References Cited

FOREIGN PATENT DOCUMENTS

| | | | |
|---|---|---|---|
| JP | 2006233203 A | * | 9/2006 |
| JP | 2009152160 | | 7/2009 |
| JP | 2014029023 | | 2/2014 |
| KR | 1020060096704 | | 9/2006 |
| KR | 1020140078557 | | 6/2014 |
| KR | 1020150002334 | | 1/2015 |
| KR | 1020200090585 | | 7/2020 |

OTHER PUBLICATIONS

Jae-Hyeong Park et al., "Piezoelectric Ceramics and Flexible Printed Circuits' Interconnection Using Sn58Bi Solder Anisotropic Conductive Films for Flexible Ultrasound Transducer Assembly," IEEE Transactions on Components, Packaging and Manufacturing Technology, vol. 9, Sep. 2019, pp. 1897-1903.

Jun-Ho Byeon et al., "A Study on the Magnetic Dispersion of the Conductive Particles of Anchoring-Polymer-Layer Anisotropic Conductive Films and Its Fine-Pitch Interconnection Properties," IEEE Transactions on Components, Packaging and Manufacturing Technology, vol. 9, Jul. 2019, pp. 1235-1243.

* cited by examiner

STRETCHABLE ACF, METHOD FOR MANUFACTURING SAME, AND INTERFACIAL BONDING MEMBER AND DEVICE COMPRISING SAME

CROSS-REFERENCE TO RELATED APPLICATION

This application is a 371 application of International PCT application serial no. PCT/KR2021/014069, filed on Oct. 13, 2021, which claims the priority benefit of Korea application no. 10-2020-0172368, filed on Dec. 10, 2020. The entirety of each of the above-mentioned patent applications is hereby incorporated by reference herein and made a part of this specification.

TECHNICAL FIELD

The following description relates to a stretchable anisotropic conductive film (ACF), a method of manufacturing the same, and an interfacial bonding member and device including the same.

BACKGROUND ART

Soft electronic products are of great interest for a wide range of applications such as stretchable displays, implantable medical devices and electronic wearable devices. As research progresses and advances, researchers have fabricated more complex and multi-layered devices. However, there are still problems to be solved in complex soft devices to get closer to commercialization.

One of them may be a physical or electrical interface between devices and layers.

Mismatches in modulus of elasticity between the hard-soft-soft layers and between the hard-soft layers may cause delamination and cracking during repeated deformation, resulting in device performance deterioration.

To solve these problems, an anisotropic conductive film (ACF) in an electrical interconnection method of a rigid electronic device, which has a simple manufacturing process and guarantees both mechanical and electrical connections, and thus makes it suitable for soft electronic applications, is known as a composite of a polymer and metal particles.

In the field of such anisotropic conductive film research, although an imidazole epoxy resin-based ACF in which solder balls are randomly distributed has conventionally been reported (J. Park, J. C. Park, S. Lee and K. Paik, "Piezoelectric Ceramics and Flexible Printed Circuits' Interconnection Using Sn58Bi Solder Anisotropic Conductive Films for Flexible Ultrasound Transducer Assembly," in IEEE Transactions on Components, Packaging and Manufacturing Technology, vol. 9, no. 9, pp. 1897-1903, September 2019, doi: 10.1109/TCPMT.2019.2907927.), there have been a problem in that random agglomerated conductive fillers have a high probability of short circuit and inefficient resolution.

Therefore, it was necessary to develop an ACF having excellent elasticity and conductivity while solving these problems.

DISCLOSURE OF THE INVENTION

Technical Goals

Technical goals to be achieved by the present disclosure is to provide a stretchable anisotropic conductive film (ACF) with excellent stretchability, a method of manufacturing the same, and an interfacial bonding member and device including the same.

However, technical goals to be achieved are not limited to those described above, and other goals not mentioned above are clearly understood by one of ordinary skill in the art from the following description.

Technical Solutions

According to an aspect of the present disclosure, there is provided a stretchable ACF including: a polymer film; and conductive particles inserted and aligned in the polymer film, wherein the conductive particles are exposed to the outside of top and bottom surfaces of the polymer film.

According to an aspect of the present disclosure, there is provided a method of manufacturing the stretchable anisotropic conductive film (ACF), including the steps of: manufacturing a polymer film patterned in a pattern including a convex portion and a concave portion; disposing conductive particles in the concave portion of the patterned polymer film to obtain a polymer film in which the conductive particles are aligned; and thermally compressing the polymer film in which the conductive particles are aligned.

According to an aspect of the present disclosure, there is provided an interfacial bonding member including the stretchable ACF.

According to an aspect of the present disclosure, there is provided a device including one or more of an electrode and an electronic component, and the interfacial bonding member.

Effects A stretchable anisotropic conductive film (ACF) according to an embodiment of the present disclosure has excellent stretchability, that is, elasticity, and thus may change along with deformation of the substrate so that it may be suitable for flexible electronic devices.

A stretchable ACF according to an embodiment of the present disclosure has excellent adhesive force and thus may be applied to electronic devices to firmly bond the interfaces of different members.

A stretchable ACF according to an embodiment of the present disclosure may maintain uniform and constant conductivity by including regularly arranged conductive particles.

A stretchable ACF according to an embodiment of the present disclosure may connect high-resolution wires by completely eliminating short circuits between adjacent wires due to particle aggregation.

A stretchable ACF according to an embodiment of the present disclosure may freely control the region where the conductive particles are arranged so that it may be used in various fields.

A stretchable ACF according to an embodiment of the present disclosure has excellent elasticity and stretchability so that even when a physical stimulus is present, the conductivity is not lowered, and thus the stability may be excellent.

A stretchable ACF according to an embodiment of the present disclosure may have conductive microparticles of the same size inserted into a polymer film in a single layer so that there may be no step difference in the height direction.

A method of manufacturing a stretchable ACF according to an embodiment of the present disclosure may provide an ACF having excellent elasticity and conductivity.

An interfacial bonding member according to an embodiment of the present disclosure may be interposed between soft and soft members or between soft and hard members to firmly bond the interface.

An interfacial bonding member according to an embodiment of the present disclosure may bond different members even with a low temperature process.

A device according to an embodiment of the present disclosure may have solid physical and chemical bonding between the stretchable ACF and the electrode or the substrate, and as a result, may have excellent interfacial bonding force between the electrode and the substrate.

Effects of the present disclosure are not limited to the above-mentioned effects, and effects not mentioned will be clearly understood by one of ordinary skill in the art from the present specification and accompanying drawings.

BEST MODE FOR CARRYING OUT THE INVENTION

Figure 1:
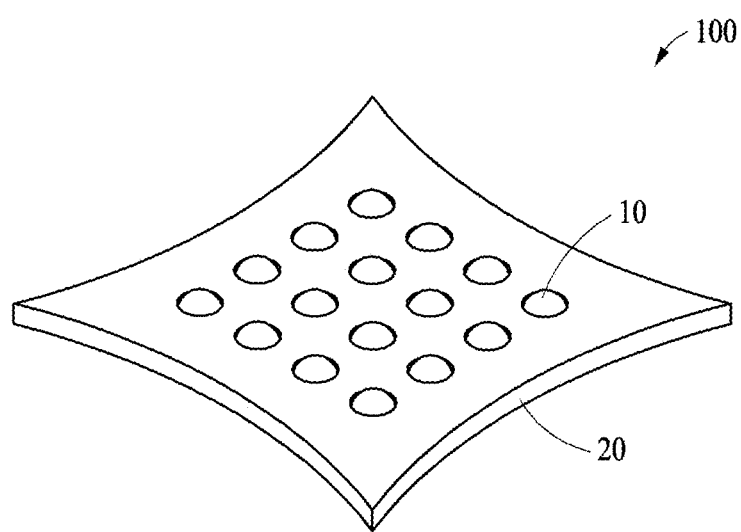
FIG. 1 is a schematic view of a stretchable anisotropic conductive film (ACF) film according to an embodiment of the present disclosure.

In this specification, when a part is said to "include" a certain component, it means that it may further include other components without excluding other components unless specifically stated otherwise.

Throughout this specification, when a member is said to be located "on" other member, this includes not only a case where a member is in contact with the other member, but also a case where another member exists between the two members.

Throughout this specification, the unit "parts by weight" may mean the ratio between the weights of the respective components.

Throughout this specification, "A and/or B" means "A and B, or A or B".

Hereinafter, the present disclosure will be described in more detail.

According to an embodiment of the present disclosure, there is provided a stretchable anisotropic conductive film (ACF) including: a polymer film; and conductive particles inserted and aligned in the polymer film, wherein the conductive particles are exposed to the outside of top and bottom surfaces of the polymer film.

According to an embodiment of the present disclosure, since the stretchable ACF has excellent stretchability, that is, elasticity, and thus may change along with the deformation of the substrate, it may be suitable for flexible electronic devices, it has excellent adhesive force and thus may firmly bond the interfaces of other members by being applied to electronic devices, it may maintain uniform and constant conductivity by including regularly arranged conductive particles, and it may freely control the region where the conductive particles are arranged so that it may be used in various fields.

According to an embodiment of the present disclosure, the stretchable ACF includes a polymer film. The polymer film may have excellent elasticity, high elongation, and low conductivity to form an ACF so that electricity may flow only at a desired location.

According to an embodiment of the present disclosure, the polymer film may include maleic anhydride-grafted thermoplastic rubber. The maleic anhydride-grafted thermoplastic rubber has excellent flexibility and elasticity, and thus may be suitable as a material for the polymer film.

According to an embodiment of the present disclosure, the thermoplastic rubber may be selected from styrene-ethylene-butylene-styrene (SEBS), styrene-isoprene-styrene (SIS), styrene-butadiene-styrene (SBS), polyurethane (PU)-based rubber, and polyolefin (PO)-based rubber, and may be desirably styrene-ethylene-butylene-styrene, but is not limited to those listed above.

According to an embodiment of the present disclosure, the thermoplastic rubber may contain 1% by weight or more of maleic anhydride based on the total weight. When maleic anhydride is contained in an amount within the above-described range, there is an effect of providing a sufficient number of bond formation sites relative to the bonding area.

According to an embodiment of the present disclosure, the polymer film may have a thickness of 10 μm to 30 μm, but is not limited within the above-described range.

According to an embodiment of the present disclosure, the stretchable ACF includes conductive particles. In contrast to the polymer film, at least the surface of the conductive particles may be conductive, thereby providing an ACF having region-selective conductivity.

According to an embodiment of the present disclosure, the conductive particles are inserted and aligned in the polymer film. That is, the conductive particles may be in a form in which they are embedded in the polymer film, and may be in a form in which they are regularly arranged and thus aligned.

The "alignment" may mean that a plurality of conductive particles is arranged at the same intervals or at intervals having a specific regularity. That is, when a certain conductive particle is said to be inserted into the polymer film, other conductive particle may be positioned at a predetermined interval, and another conductive particle may also be positioned at a predetermined interval from the other conductive particle.

According to an embodiment of the present disclosure, the conductive particles may be aligned in any one of lattice-shaped, honeycomb-shaped, linear, and quadrangular arrangement forms, but are not limited thereto and may be arranged in various forms as needed.

In addition, according to an embodiment of the present disclosure, the distance between the conductive particles may be from 10 μm to 400 μm, but is not limited thereto, and may be adjusted according to the arrangement form, the diameter of the conductive particles, and the field of utilization of the stretchable ACF. The distance between the conductive particles may mean a distance from the center of one conductive particle to the center of another conductive particle.

According to an embodiment of the present disclosure, for example, when the polymer film is referred to as a two-dimensional plane in a case in which the conductive particles are aligned in a lattice shape, if one conductive particle is referred to as the origin where the x-axis and y-axis intersect, other conductive particle may be located at the positions of (x, y)=(L, 0), (−L, 0), (0, L), (0, −L), (L, L), (L, −L), (−L, −L), and (−L, L), and each of conductive particles becomes the origin again so that the conductive particles may be positioned at the L distance in the same vertical direction.

That is, according to an embodiment of the present disclosure, the distance between the conductive particles may be from L to 1.41 L. Specifically, the distance between the conductive particle at the origin and the particles in the vertical direction, that is, on the x-axis and the y-axis, may be L, and the distance between the particles on a plane other than the axis may be √2L, that is, about 1.41 L.

In this case, that is, when the conductive particles are aligned in a lattice shape, L may be 15 μm to 400 μm.

In addition, for example, when the polymer film is referred to as a two-dimensional plane in a case in which the conductive particles are aligned in a honeycomb shape, if one conductive particle is referred to as the origin where the x-axis and y-axis intersect, another conductive particle may be located at the positions of (x, y)=(L, 0), (−L, 0), (0.5L, 1.73L), (−0.5L, 1.73L), (0.5L, −1.73L), and (−0.5L, −1.73L), and each of conductive particles becomes the origin again so that six of the conductive particles may be positioned at a distance of L.

That is, according to an embodiment of the present disclosure, the distance between the conductive particles may be L. Specifically, all six conductive particles closest to the conductive particle at the origin may be located at a distance L.

In this case, that is, when the conductive particles are aligned in a honeycomb shape, L may be 15 μm to 400 μm.

When the conductive particles are aligned at intervals within the above-described range, performance such as conductivity and resolution may be constant within the entire area of the stretchable ACF due to the regular arrangement of the particle diameter units, and thus accurate design of the electrode interconnection may be possible.

According to an embodiment of the present disclosure, the material and shape of the conductive particle are not particularly limited, but it is preferable that at least the surface is a metal material and has a spherical shape. Specifically, the conductive particles may be metal particles, hollow metal particles, or particles having a non-conductive material inside and a conductive coating only on the surface. However, they are not limited to those described above, and those used in the art may be used.

According to an embodiment of the present disclosure, the conductive particles may be a core-shell structure including: a core including a polymer; and a shell including a metal. When it includes a core containing a polymer and a shell containing a metal, conductive particles having a uniform size may be used for the stretchable ACF, and the weight of the stretchable ACF may be reduced, thereby promoting weight reduction of the device and having the effect of reducing production costs.

According to an embodiment of the present disclosure, the conductive particles may have a diameter of 10 μm to 200 μm. The above-described numerical range corresponds to a particle size range of conductive particles used in the corresponding technical field, and thus various technical applications may be possible. Additionally, each of the individual conductive particles may have the same diameter. When the conductive particles having the same diameter are used, a separate bumper layer for anisotropic conduction may not be required since there is no step difference in the height direction of the stretchable ACF.

According to an embodiment of the present disclosure, the conductive particles may be aligned in a partial region of the polymer film. That is, when the polymer film is referred to as a two-dimensional plane, a region in which the conductive particles are aligned may exist only in a portion of the corresponding area. The position of the region may vary depending on the device utilizing the stretchable ACF, and the position of the region may be adjusted according to the purpose.

In addition, the region may be one or a plurality of regions, and the number of regions may vary depending on a device using the stretchable ACF or a purpose of utilization.

FIG. 1 is a schematic view of a stretchable ACF film according to an embodiment of the present disclosure. Referring to FIG. 1, the conductive particles may be aligned on a partial region of a polymer film.

According to an embodiment of the present disclosure, the conductive particles are exposed to the outside of the top and bottom surfaces of the polymer film. When the conductive particles are exposed to the outside of the top and bottom surfaces of the polymer film, a current flowing from a member in contact with one surface of the stretchable ACF may be allowed to flow to another member in contact with the other surface of the stretchable ACF, and may function as a conduction path.

Figure 3:
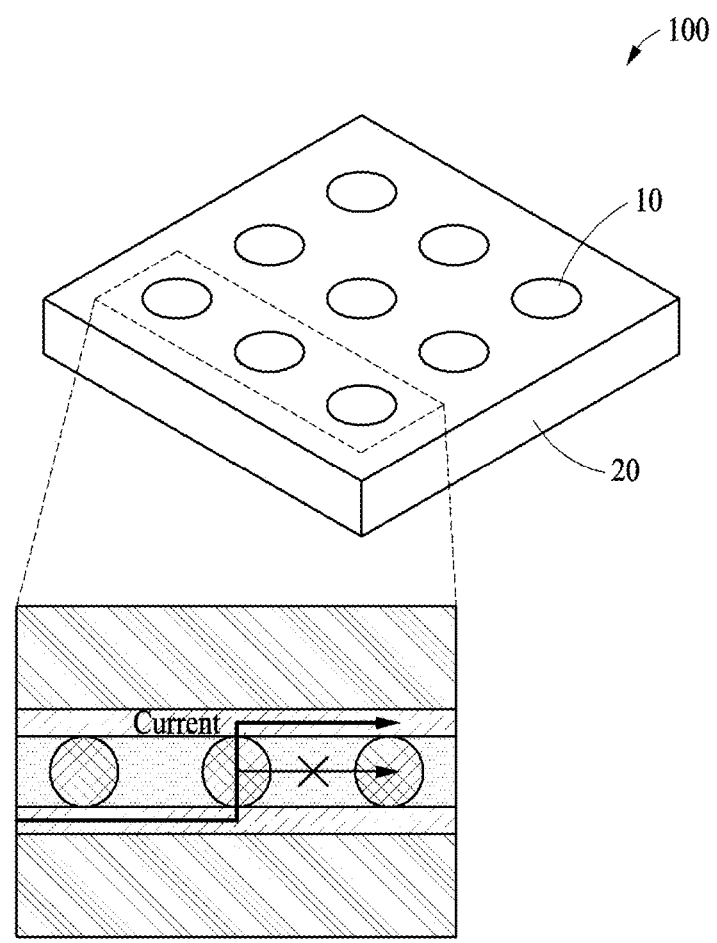
FIG. 3 is a schematic view of a case in which conductive particles of a stretchable ACF according to an embodiment of the present disclosure function as a conduction path.

FIG. 3 shows a schematic view of a case in which conductive particles of a stretchable ACF according to an embodiment of the present disclosure function as a conduction path.

Referring to FIG. 3, it may be confirmed in a stretchable ACF according to an embodiment of the present disclosure that, as a vertical conduction path, current may flow in a vertical direction through portions exposed to the outside of the top and bottom surfaces of the polymer film (blue arrow), but the polymer film is non-conductive so that no current may flow in the horizontal direction (black arrow).

According to an embodiment of the present disclosure, 10% to 30%, 14% to 30%, 10% to 21%, or 14% to 21% of the outer surface of the conductive particles may be exposed to the outside of the polymer film. When the outer surface is exposed at a fraction within the above-described range, it may be possible to ensure excellent conductivity since it has low connection resistance while minimizing the step difference of the stretchable ACF.

According to an embodiment of the present disclosure, the region where the conductive particles are exposed may be on the same plane as the polymer film. The region where the conductive particles are exposed may be a shape of the conductive particles deformed by a stretchable ACF manufacturing process.

The stretchable ACF according to an embodiment of the present disclosure may have a stress of 10 MPa or less, 8 MPa or less, or 5 MPa or less when stretched to an elongation of 100%. When the stretchable ACF has a stress within the above-described range when stretched to an elongation of 100%, the stretchable ACF may have excellent elasticity, and even when a physical stimulus is present, the conductivity does not decrease, and thus the conduction stability may be excellent.

In addition, the stretchable ACF according to an embodiment of the present disclosure may have a stress of 10 MPa or less when stretched at an elongation of 200%.

When the stretchable ACF according to an embodiment of the present disclosure is stretched at an elongation of 80% while a current is being flowed thereto, the relative current value according to Equation 1 below may be 0.8 or more and less than 1.05. That is, the stretchable ACF according to an embodiment of the present disclosure may have excellent conduction stability since conductivity is not lowered even in the case in which there is a stretch stimulus.

$$\text{Relative Current} = I/I_0 \quad \text{[Equation 1]}$$

In Equation 1, I denotes a current measured in a stretched state at an elongation of 80%, and $I_0$ denotes a current measured in a non-stretched state.

According to an embodiment of the present disclosure, there is provided a method of manufacturing the stretchable anisotropic conductive film (ACF), including the steps of: manufacturing a polymer film patterned in a pattern including a convex portion and a concave portion; disposing conductive particles in the concave portion of the patterned polymer film to obtain a polymer film in which the conductive particles are aligned; and thermally compressing the polymer film in which the conductive particles are aligned.

The method of manufacturing a stretchable ACF according to an embodiment of the present disclosure may provide an ACF having excellent elasticity and conductivity.

Hereinafter, each step of the method will be described in detail.

According to an embodiment of the present disclosure, a polymer film patterned in a pattern including a convex portion and a concave portion is first manufactured. When the stretchable ACF is used to attach a member such as a circuit board, the pattern including the convex portion and the concave portion may be according to a region requiring conduction in the corresponding circuit.

According to an embodiment of the present disclosure, the step of manufacturing the patterned polymer film is not particularly limited, and the patterned polymer film may be manufactured by a method used in the field of imprint lithography technology. Embodiments thereof are as follows, but are not limited thereto.

According to an embodiment of the present disclosure, the step of manufacturing the patterned polymer film may include the steps of: manufacturing a multi-use stamp; and thermally compressing the multi-use stamp with the polymer film to manufacture a polymer film patterned in a pattern including a convex portion and a concave portion.

Figure 2:
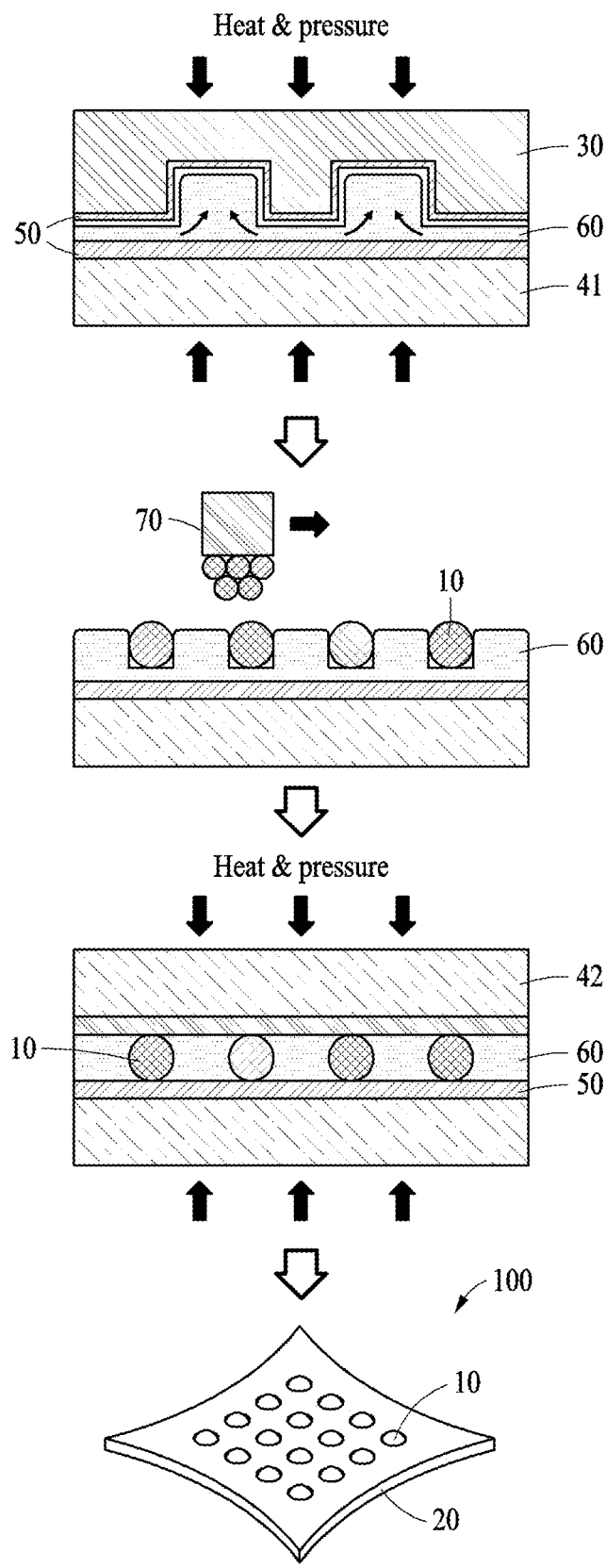
FIG. 2 is a schematic view of a method of manufacturing a stretchable ACF according to an embodiment of the present disclosure.

FIG. 2 shows a schematic view of a method of manufacturing a stretchable ACF according to an embodiment of the present disclosure. Referring to FIG. 2, a stretchable ACF 100 may be manufactured by thermally compressing a multi-use stamp 30 with a polymer film to manufacture a patterned polymer film 60, disposing conductive particles 10 in a concave portion of the patterned polymer film 60, and then thermally compressing the polymer film 60 in which the conductive particles are aligned.

According to an embodiment of the present disclosure, the step of manufacturing a multi-use stamp is not particularly limited, and the multi-use stamp may be manufactured by a method used in the field of imprint lithography technology. Embodiments thereof are as follows, but are not limited thereto.

Specifically, the step of manufacturing a multi-use stamp may include the steps of: forming a photoresist layer by coating and curing a photoresist on a substrate; positioning a photomask on the photoresist layer and irradiating light to form a patterned photoresist layer; and manufacturing a mold by additionally curing the patterned photoresist layer and immersing it in a developing solution; and manufacturing a multi-use stamp containing a pattern including a convex portion and a concave portion using the mold.

First, a photoresist layer may be formed by coating and curing a photoresist on a substrate. The substrate is not particularly limited, and may include materials selected from silicon wafers, glass, indium tin oxide (ITO), and metal substrates such as gold, aluminum, copper, nickel, and the like.

The photoresist may be used without particular limitation as long as it is used in the corresponding technical field, and may include, for example, a photosensitive resin. Desirably, one having a level of processability suitable for forming a pillar shape positioned on a substrate may be used, and particularly in the pillar shape, one having a level of processability suitable for forming a shape having a ratio of pillar height to pillar diameter of 4 or more may be used.

A method of coating the photoresist is not particularly limited, and may be performing coating using a spin coating method for uniform coating. In addition, the coating may be performed once or twice or more, and a thicker photoresist layer may be formed when the coating is performed several times.

The process of curing the photoresist may be performed as a step of performing a first heat treatment and a step of performing a second heat treatment. The step of performing a first heat treatment may be performed at a temperature of 50° C. to 70° C. for 5 minutes to 15 minutes, and the step of performing a second heat treatment may be performed at a temperature of 80° C. to 100° C. for 15 minutes to 25 minutes.

A photomask may be positioned on the photoresist layer thus formed and light may be irradiated to form a patterned photoresist layer. The photoresist may include a photosensitive resin, deformation of the molecular structure of the photosensitive resin contained in the photoresist may be performed by an exposure process of positioning a photomask including a predetermined pattern on the photoresist layer and irradiating light thereto, and a difference in physical properties from the unexposed portion may be formed.

The photomask may finally include a pattern having a desired shape. Specifically, a light beam passing through the light transmission part of the photomask may deform and photocure the molecular structure of the resin of the photoresist, and the photoresist layer under the light non-transmission part of the photomask does not undergo deformation of the molecular structure due to the light beam so that separate photocuring may not proceed. That is, the photocured photoresist and non-photocured photoresist formed according to the shape of the pattern included in the photomask may form a concave portion and a convex portion of the mold by a developing solution treatment described later.

The photomask may have a shape including a plurality of cells, and may have any one of a lattice shape, a honeycomb shape, a linear shape, and a quadrangular shape. In addition, the size of the cell may be larger than the diameter of the conductive particle, and may have a size of, for example, more than 500 nm and not more than 100 μm.

The step of forming the patterned photoresist layer may be performed by irradiating light having a wavelength of 300 nm to 400 nm, and light may be irradiated for 30 seconds to 50 seconds, and may be irradiated with an energy density of 20 mW/cm$^2$ to 40 mW/cm$^2$. When light having a wavelength within the above-described range is irradiated with an energy density within the above-described range for a time within the above-described range, the photoreaction of the photoresist layer may be performed smoothly, and in particular, the light transmission part of the photomask may be sufficiently photoreacted.

According to an embodiment of the present disclosure, the patterned photoresist layer may be additionally cured. The additional curing may be performed by performing a step of performing a first additional heat treatment and a step of performing a second additional heat treatment, and the step of performing a first additional heat treatment may be performed at a temperature of 50° C. to 70° C. for 5 minutes to 15 minutes, and the step of performing a second additional heat treatment may be performed at a temperature of 80° C. to 100° C. for 15 minutes to 25 minutes.

In addition, the first additional heat treatment may be performed for a shorter time than the first heat treatment, and the second additional heat treatment may be performed for a shorter time than the second heat treatment.

Through the additional curing, the curing degree of the photocured photoresist may be increased, and the photocured photoresist may not be dissolved or the photocured photoresist layer may not be damaged in a developing step described later.

According to an embodiment of the present disclosure, after the additional curing, the patterned photoresist layer may be immersed in a developing solution to manufacture a mold. When the patterned photoresist layer is immersed in the developing solution, the non-photocured photoresist formed on the light non-transmission part of the photomask has a low degree of curing and thus may be removed by the developing solution. That is, the photocured photoresist formed by performing light irradiation through the light transmission part of the photomask has a high degree of curing so that it may not be removed even when immersed in a developing solution, thereby forming the convex portion of the mold, and the non-photocured photoresist formed on the light non-transmission part may form a concave portion of the mold by being removed by the developing solution.

As the developing solution, one used in the corresponding technical field may be used, and a solution suitable for development may be used in consideration of the type of photoresist. The developing solution may include an organic solvent capable of dissolving the photoresist.

According to an embodiment of the present disclosure, development may be performed by immersing the patterned photoresist layer in a developing solution for 10 to 30 minutes or 15 to 20 minutes. When the development proceeds for a time within the above-described range, the step difference between the concave part and the convex part of the mold is sufficiently provided so that the pattern may be clarified, and accordingly, the problem of blurring the pattern during the transfer process may not occur, and the multi-use stamp and the patterned polymer film manufactured by the mold later may have an appropriate level of step difference for accurately disposing the conductive particles.

According to an embodiment of the present disclosure, the mold may be manufactured based on the patterned photoresist layer, and since the photoresist layer forms a concave portion and a convex portion based on the photomask, the mold may have a shape including a plurality of cells, and may have any one of a lattice shape, a honeycomb shape, a linear shape, and a quadrangular shape. In addition, the size of the cell may be larger than the diameter of the conductive particle, and may have a size of, for example, more than 500 nm and not more than 100 μm.

According to an embodiment of the present disclosure, the mold may have a form in which photocured photoresist pillars are formed on a substrate. That is, the convex portions of the mold may be photocured photoresist pillars, and the concave portions of the mold may be spaces between the photocured photoresist pillars.

According to an embodiment of the present disclosure, a multi-use stamp containing a pattern including a convex portion and a concave portion may be subsequently manufactured using the mold. The convex portion and the concave portion may be formed in the mold as described above, the convex portion of the mold may form the concave portion of the multi-use stamp, and the concave portion of the mold may form the concave portion of the multi-use stamp.

The step of manufacturing the multi-use stamp may include the steps of: forming a polymer pattern layer by pouring and curing a prepolymer solution on the mold; and manufacturing a multi-use stamp by pouring and curing a photocurable resin composition on the polymer pattern layer.

The mold includes a concave portion and a convex portion of the same shape as a desired multi-use stamp, but since the mold includes photoresist pillars formed on a substrate, bonding force between the substrate and the photoresist pillar is low so that it may not be used as a multi-use stamp. Therefore, a multi-use stamp may be manufactured through the process as described above.

The prepolymer solution may include PDMS, but is not limited thereto, and may include silicon-based rubber having low surface energy as one used in the corresponding technical field so that demolding, i.e., the process of separation from the mold is easy. For example, Ecoflex or Dragon skin among commercially available products may be used.

The prepolymer solution may include a liquid prepolymer, and may include one or more additives among a solvent, a crosslinking agent, an initiator, an antifoaming agent, and a chain extender.

The polymer pattern layer may be formed by curing the prepolymer solution at a temperature of 50° C. to 150° C., or 70° C. to 90° C. for 2 hours to 4 hours, or 3 hours.

According to an embodiment of the present disclosure, a degassing process may be performed after the photocurable resin composition is poured onto the polymer pattern layer and before curing. In order to prevent a phenomenon in which the photocurable resin composition does not sufficiently penetrate into the concave portion of the polymer pattern layer due to a capillary phenomenon when the photocurable resin composition is poured onto the polymer pattern layer according as the polymer pattern layer includes a concave portion having a very narrow diameter, a degassing process of removing gas located in the space between the photocurable resin composition and the concave portion of the polymer pattern layer may be performed so that the photocurable resin composition penetrates deeply into the concave portion of the polymer pattern layer, and accordingly a multi-use stamp having a high similarity in shape to the polymer pattern layer may be formed.

The photocurable resin composition may include a photocurable resin, and the photocurable resin is not particularly limited and may include those used in the corresponding technical field.

A cured product of the photocurable resin composition may have an appropriate modulus, and may have, for example, a Shore A hardness more than 61 and less than 95.

In addition, the multi-use stamp may be manufactured by light-irradiating and curing the photocurable resin composition at an energy density of 196 mW/cm$^2$ to 134 mW/cm$^2$, or 198 mW/cm$^2$ to 132 mW/cm$^2$ for 20 minutes to 30 minutes.

According to an embodiment of the present disclosure, since the multi-use stamp may be manufactured based on the mold, it may have a shape including a plurality of cells, and may have any one of a lattice shape, a honeycomb shape, a linear shape, and a quadrangular shape. In addition, the size of the cell may be larger than the diameter of the conductive particle, and may have a size of, for example, more than 500 nm and not more than 100 m.

According to an embodiment of the present disclosure, a surface of the multi-use stamp on which the concave portion and convex portion are formed may be surface-treated with silane. The multi-use stamp may be surface-treated with silane, thereby easily separating the multi-use stamp after patterning the polymer film.

According to an embodiment of the present disclosure, a polymer film patterned in a pattern including a convex portion and a concave portion may be manufactured by thermally compressing the multi-use stamp manufactured as described above with the polymer film. The multi-use stamp may be one which is manufactured as described above and has a pattern including a convex portion and a concave portion.

The convex and concave portions of the multi-use stamp may be those which are in contact with the soft polymer film, and in which the polymer film is deformed and patterned according to the pattern of the multi-use stamp by thermocompression. That is, the concave portion of the patterned polymer film may be formed by the convex portion of the multi-use stamp, and the convex portion of the patterned polymer film may be formed by the concave portion of the multi-use stamp.

According to an embodiment of the present disclosure, the polymer film may be thermally compressed on a substrate, and the substrate may be surface-treated with silane on the surface on which the polymer film is formed. The substrate may be a slide glass, but is not particularly limited, and it may be surface-treated with silane, thereby easily separating the stretchable ACF manufactured later.

According to an embodiment of the present disclosure, the polymer film may be manufactured by coating maleic anhydride-grafted thermoplastic rubber with a solution containing 5% by weight to 20% by weight, 6% by weight to 20% by weight, 6% by weight to 12% by weight, 8% by weight to 12% by weight, or 6% by weight to 12% by weight, and drying it. When the polymer film includes maleic anhydride-grafted thermoplastic rubber in an amount within the above-described numerical range, the stretchable ACF to be manufactured is manufactured so as to correspond to the desired shape so that when applied to devices, etc., the connection rate is excellent and thus the conductivity may be excellent.

According to an embodiment of the present disclosure, the thermoplastic rubber may be selected from styrene-ethylene-butylene-styrene (SEBS), styrene-isoprene-styrene (SIS), styrene-butadiene-styrene (SBS), polyurethane (PU)-based rubber, and polyolefin (PO)-based rubber.

According to an embodiment of the present disclosure, the polymer film may have a thickness of 10 μm to 30 μm, or 15 μm to 20 μm.

According to an embodiment of the present disclosure, the step of thermally compressing the multi-use stamp with the polymer film may be performed by performing thermocompression at a temperature of 150° C. to 200° C., 160° C. to 200° C., 150° C. to 190° C., 160° C. to 190° C., 160° C. to 180° C., or 170° C. to 180° C. for 5 minutes to 20 minutes, 7 minutes to 15 minutes, or 9 minutes to 11 minutes. When thermocompression is performed at a temperature and pressure within the above-described ranges, patterning of the polymer film may be performed smoothly, a polymer film for a stretchable ACF may be molded without destroying the multi-use stamp, and it may be molded so that the pressure in the thermocompression region is uniformly dispersed to have accurate dimensions, and accordingly the disposition accuracy of the particles may be improved.

According to an embodiment of the present disclosure, the step of thermally compressing the multi-use stamp with the polymer film may be performed by applying a pressure of 5 MPa to 20 MPa, or 7.0 MPa to 15.7 MPa, but may be performed by applying sufficient pressure to pattern the polymer film without being limited to the above-described range. In addition, the method of applying the pressure is not particularly limited either, and for example, compression may be performed by gravity by placing a weight, and compression may also be performed by magnetic force by positioning permanent magnets on the lower and upper portions.

According to an embodiment of the present disclosure, the maximum step difference of the convex portion and the concave portion of the patterned polymer film, that is, the depth thereof may be 5 μm to 350 μm. In the case of having a step height within the above-described range, the conductive particles may be accurately disposed in the concave portion as will be described later.

According to an embodiment of the present disclosure, the maximum step height between the convex portion and the concave portion of the patterned polymer film, that is, the depth thereof may be 0.3 to 0.8 times, 0.5 to 0.8 times, 0.6 to 0.8 times, or 0.7 times the diameter of the conductive particles. In the case of having the maximum step difference within the above-described range, since the conductive particles not only are well inserted into the concave portion, but also are not easily removed after being inserted, stability in a process may be excellent.

According to an embodiment of the present disclosure, since the patterned polymer film may be manufactured based on the multi-use stamp, it may have a shape including a plurality of cells, and may have any one of a lattice shape, a honeycomb shape, a linear shape, and a quadrangular shape. In addition, the size of the cell may be larger than the diameter of the conductive particle, and may have a size of, for example, more than 500 nm and not more than 100 μm.

According to an embodiment of the present disclosure, the concave portion may have the shape of a space formed by the convex portion, and the space may be a space having a larger size than the diameter of the conductive particle. Specifically, the size of the concave portion of the patterned polymer film, that is, the width thereof may be more than 1.0 times and not more than 1.5 times the diameter of the particle. Accordingly, one conductive particle may be accurately and stably disposed in one concave portion in the concave portion. The conductive particles are disposed in this way, and thus a polymer film in which the conductive particles are aligned may be obtained.

According to an embodiment of the present disclosure, conductive particles are disposed in the concave portion of the patterned polymer film manufactured as described above. A process of disposing conductive particles is not particularly limited, but may be performed, for example, in the following manner.

According to an embodiment of the present disclosure, the step of disposing conductive particles may include the steps of: positioning a plurality of conductive particles on a portion or the entirety of the patterned polymer film; positioning an elastic member on the conductive particles at a separation distance of 1 to 10 times the diameter of the conductive particles from the patterned polymer film; and reciprocating the patterned polymer film once or a plurality of times in one direction by a predetermined distance so that the elastic member inserts the conductive particles into the concave portion of the patterned polymer film.

First, a plurality of conductive particles may be positioned on a portion or the entirety of the patterned polymer film. Specifically, a plurality of conductive particles may be positioned on a patterned surface including a concave portion and a convex portion of the patterned polymer film.

Details of the conductive particles may be as described above.

The process of disposing the particles is a dry process and may be applied to a process of disposing conductive particles of various sizes.

Next, an elastic member may be positioned on the conductive particles at a separation distance of 1 to 10 times, 1 to 5 times, 1 to 2 times, or 1.5 times the diameter of the conductive particles from the patterned polymer film. The elastic member may serve to hold the conductive particles, and more specifically, may directly contact the conductive particles and serve to perform rubbing on a pattern including a concave portion and a convex portion formed in the polymer film.

As the elastic member, polydimethylsiloxane (PDMS), polyurethane acrylate (PUA), polymethyl methacrylate (PMMA), polybutadiene (PB), polyurethane (PU), styrene-butadiene rubber (SBR), polyvinylidene fluoride (PVDF), poly(vinylidenefluoride-co-trifluoroethylene) (PVDF-TrFE), polystyrene (PS), poly(ethylene glycol) diacrylate (SBS PEDGA), ploy(styrene-butadiene-styrene) (SBS), poly(styreneethylene-butylene-styrene) (SEBS), poly(styrene-isoprene-styrene) (SIS), or the like may be possible, but it may be desirably PDMS.

Then, the elastic member may insert the conductive particles into the concave portion of the patterned polymer film by reciprocating the patterned polymer film once or a plurality of times in one direction by a predetermined distance.

The patterned polymer film may be positioned and moved on a moving member, and the moving member may be a belt of a conveyor.

When the belt is deformed into a C or D shape while moving, the patterned polymer film on the belt may be correspondingly deformed into a C or D shape so that the conductive particles are continuously disposed on a large area.

In addition, desirably, a portion of the patterned polymer film is moved using the moving member, and the patterned polymer film is reciprocated once or a plurality of times in one direction by a predetermined distance, and thus the conductive particles may be inserted into a concave portion of another portion of the patterned polymer film, and the above-described steps may be repeated each a plurality of times as needed.

Through the above-described process, the conductive particles may be aligned in the concave portion of the patterned polymer film.

According to an embodiment of the present disclosure, a stretchable ACF may be manufactured by obtaining a polymer film in which conductive particles are aligned through the above-described process and thermally compressing the polymer film. Conductive particles may be aligned in the concave portion of the polymer film, and when it is thermally compressed, the polymer film may be deformed to fill gaps between the conductive particles and the polymer film, and a stretchable ACF in which the conductive particles are firmly inserted into the polymer film may be manufactured.

According to an embodiment of the present disclosure, the step of thermally compressing the polymer film in which the conductive particles are aligned may be performed by performing thermocompression at a temperature of 100° C. to 300° C., 130° C. to 300° C., 100° C. to 280° C., 130° C. to 280° C., 130° C. to 250° C., 130° C. to 235° C., 130° C. to 200° C., 180° C. to 235° C., or 235° C. to 280° C. for 1 hour to 4 hours, or 2 hours. When thermocompression is performed at a temperature and time within the above-described ranges, the polymer may be properly deformed and closely adhered to the conductive particles, and all of the polymer remaining on the exposed surface of the conductive particles may be removed to have an effect of reducing contact resistance. The temperature and time at which the step of performing thermocompression is performed may be adjusted according to the type of thermoplastic rubber included in the polymer film.

According to an embodiment of the present disclosure, the step of thermally compressing the polymer film in which the conductive particles are aligned may be performed by applying a pressure of 50 MPa to 150 MPa, or 57.1 MPa to 128 MPa, but may be performed by applying sufficient pressure so that the polymer film and the conductive particles are properly deformed and brought into close contact with each other without being limited to the above-described range. In addition, the method of applying the pressure is not particularly limited either.

According to an embodiment of the present disclosure, a step of surface-treating one or both surfaces of the stretchable ACF with oxygen plasma may be further included after the step of performing the secondary thermocompression. When the surface of the stretchable ACF is surface-treated with oxygen plasma, the surface energy may increase and the surface may be made to change into relatively hydrophilic, thereby improving interfacial adhesive force with other members.

The stretchable ACF manufactured by the method according to an embodiment of the present disclosure may have an alignment maintenance degree of 0.8 to 1.0. The "alignment maintenance degree" may refer to the number of conductive particles per unit area after secondary thermocompression relative to the number of conductive particles per unit area before secondary thermocompression, and may be expressed by Equation 2 below.

$$\text{Alignment maintenance degree} = N/N_0 \quad \text{[Equation 2]}$$

In Equation 2, N denotes the number of conductive particles per unit area after the second thermocompression, and $N_0$ denotes the number of conductive particles per unit area before the second thermocompression.

When the secondary thermocompression is performed, a phenomenon in which the number of conductive particles per unit area is reduced by compression occurs while a phenomenon in which the polymer film is melted occurs. Accordingly, when an excessive amount of the polymer is melted, there is a concern that the final ACF may be obtained in a shape different from that of the desired stretchable ACF.

When the alignment maintenance degree is within the above-described numerical range, a stretchable ACF that is to be manufactured is manufactured so as to correspond to the desired shape so that when applied to devices, etc., the connection rate is excellent and thus the conductivity may be excellent, and the aggregation of the conductive particles does not occur and thus the electrical resolution of the ACF may be increased. In addition, since the stretchable ACF may be manufactured in a state in which the alignment before thermocompression is maintained, the alignment maintenance degree is pre-calculated in consideration of the width of a wiring such as a circuit or the like for using the stretchable ACF as an adhesive member, and the stretchable ACF may be manufactured according to the corresponding circuit.

According to an embodiment of the present disclosure, an interfacial bonding member including the stretchable ACF is provided. The stretchable ACF is included, and thus the interfacial bonding member is interposed between soft and soft members or between soft and hard members so that the interface may be firmly bonded.

According to an embodiment of the present disclosure, a device including at one or more of an electrode and an electronic component and the interfacial bonding member is provided. The device may be applied to the semiconductor industry, the display industry, etc. in various forms within the range utilized in the corresponding technical field.

According to an embodiment of the present disclosure, the device may include one or more of an electrode and an electronic component. Specifically, the device may include one or more electrodes, one or more electronic components, or one or more electrodes and one or more electronic components.

According to an embodiment of the present disclosure, the electronic component may include one or more of an active element and a passive element. The active element may include an electronic member forming an integrated circuit such as a driving chip, a light emitting element, and a memory element. Also, the electronic component may be a wiring.

According to an embodiment of the present disclosure, the electrode may include a substrate on which a conductive material layer is formed. The substrate may be an insulating material such as a polymer substrate, and the conductive material layer may include a metal such as gold.

According to an embodiment of the present disclosure, the interfacial bonding member may bond between the electrodes when a device includes one or more electrodes, bond between the electronic components when the device includes one or more electronic components, or bond one or more of: between the electrodes; between the electronic components; and between the electrode and the electronic component when the device includes one or more of the electrodes and one or more of the electronic components.

When the interfacial bonding member including the stretchable ACF according to an embodiment of the present disclosure is bonded to a wiring, electrical connection may not be guaranteed since the number of contacting conductive particles varies depending on the shape of the wiring. Therefore, according to an embodiment of the present disclosure, the stretchable ACF may be bonded to a wiring having a width capable of including at least one particle.

Figure 4:
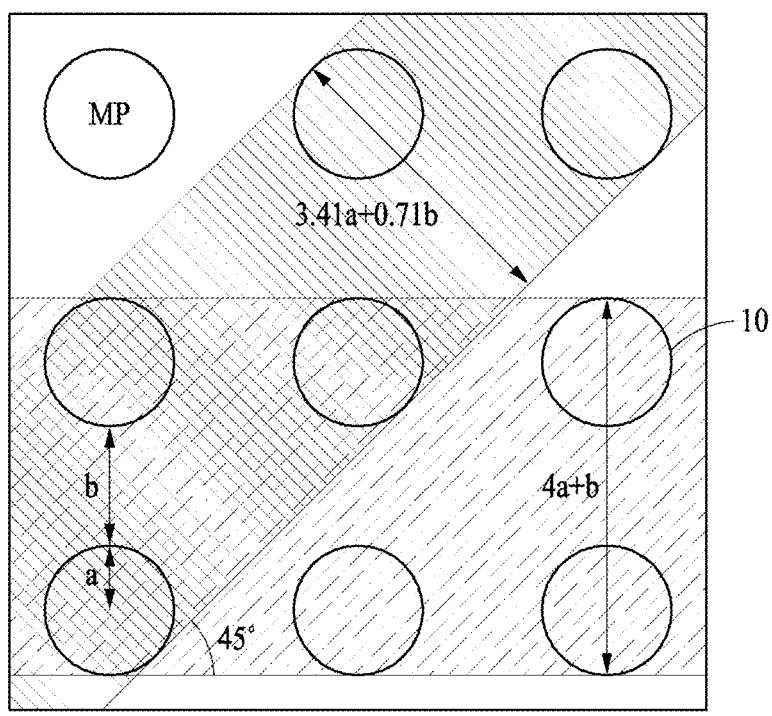
FIG. 4 is a schematic view for calculating a minimum width of a connectable wiring in a form in which conductive particles of a stretchable ACF according to an embodiment of the present disclosure are arranged.

FIG. 4 shows a schematic view for calculating a minimum width of a wiring in a form in which conductive particles of a stretchable ACF according to an embodiment of the present disclosure are arranged.

Specifically, when the radius of the conductive particles is a and the distance between the outer surfaces of the conductive particles is b, if the wiring is disposed at an angle of 45° with respect to the array of the conductive particles as shown in the red shading, the electrical connection may be guaranteed if the wiring has a width of at least 3.41a+0.71b or more, and if the wiring is disposed at an angle of 0° with respect to the array of the conductive particles as shown in the blue shading, the electrical connection may be guaranteed if the circuit has a width of at least 4a+b or more.

The minimum width of the wiring may be calculated differently depending on the arrangement shape of the conductive particles, the size of the conductive particles, and the distance between the conductive particles, and the conductivity of the stretchable ACF according to an embodiment of the present disclosure for a circuit having such a minimum width this may be guaranteed.

According to an embodiment of the present disclosure, the substrate may be a flexible substrate or a stretchable substrate. The flexible substrate may be a substrate whose shape may be changed by an external force but whose size may not be changed, and the stretchable substrate may be a substrate whose shape is changed by an external force but whose size may be changed together.

According to an embodiment of the present disclosure, one or more of the electrode and the electronic component may have a surface which is in contact with the interfacial bonding member and on which a hydrophilic surface treatment is performed.

According to an embodiment of the present disclosure, the hydrophilic surface treatment may be an oxygen plasma treatment. When the oxygen plasma treatment is performed on the surface of the electrode and/or the substrate, surface energy may be improved by introducing a hydroxyl group to the surface, and accordingly a chemical bond with the stretchable ACF may be formed to improve bonding force.

According to an embodiment of the present disclosure, a silane compound may be used in the hydrophilic surface treatment, and the silane compound may include one or more of a thiol group, an amine group, a glycidyl group, a hydroxyl group, a carboxyl group, a vinyl group, a phosphonate group, an anhydride group, a (meth)acrylate group, an isocyanate group, an aldehyde group, a cyano group, an azide group, an ester group, and a halogen substituent. When a silane compound containing the above-listed functional groups is used, the hydrophilic functional group forms a chemical bond with the polymer film so that bonding force between the stretchable ACF and the electrode or the substrate may be improved.

According to an embodiment of the present disclosure, when one or more of the electrode and the electronic component are subjected to a hydrophilic surface treatment on a surface in contact with the interfacial bonding member, they may be bonded with the stretchable ACF only by performing simple compression even at a low temperature of about 50° C. to 100° C. by chemical bonding, and accordingly, the bonding stability may be excellent since a phenomenon in which the polymer film dissolves or the conductive particles move does not occur. In addition, the compression may be performed at a pressure of 0.1 MPa or more, but is not limited to the above-described range. In addition, the method of applying the pressure is not also particularly limited, and for example, the member may be compressed directly by hand.

Hereinafter, examples will be described in detail to explain the present disclosure in detail. However, examples according to the present disclosure may be modified in many different forms, and the scope of the present disclosure is not construed as being limited to the examples described below. The examples of this specification are provided to more completely explain the present disclosure to one of ordinary skill in the art.

Materials Used

SU-8 50: MICROCHEM, USA (photoresist)
Polydimethylsiloxane prepolymer: Dow Corning, USA
Sylgard 184: Dow Corning, USA (crosslinking agent)
NOA61: Norland Products, Inc., USA
Styrene-ethylene-butylene-styrene grafted with maleic anhydride (SEBS-g-MA, MA content is 2% by weight or less): Sigma-Aldrich Corporation.
Trichloro(octadecyl)silane (OTS, molecular weight of 387.93 g/mol): Sigma-Aldrich Corporation.
Chloroform (99.5%): Samchun Chemicals, Korea
Toluene (99.8%): Samchun Chemicals, Korea
Gold-coated conductive microparticles (diameter of 3.25 µm): Deoksan Co., Korea
Polyimide film (thickness of 50 µm)
(3-mercaptopropyl)trimethoxysilane (MPTMS, 95%): Sigma-Aldrich Corporation.
(3-aminopropyl)triethoxysilane (APTES, 99%): Sigma-Aldrich Corporation.
(3-glycidyloxypropyl)trimethoxysilane (GPTMS, 98%): Sigma-Aldrich Corporation.

Example 1

Manufacture of Multi-Use Stamp

After washing and drying a native Si wafer, it was cut into 2.5 cm×2.5 cm. SU-8 50 photoresist was spin-coated on the Si wafer at 500 rpm for 10 seconds and 2,000 rpm for 30 seconds. Then, heat treatment was performed twice at 65° C. for 10 minutes and at 95° C. for 20 minutes. Thereafter, a photomask was positioned thereon and exposed to 30 mW/cm² ultraviolet light with a wavelength of 365 nm for 36 seconds.

The slightly cross-linked photoresist was post-heat treated at 65° C. for 9 minutes and 95° C. for 12 minutes and then immersed in a developing solution to remove an unexposed SU-8 prepolymer. Then, after rinsing it with IPA, the solution was removed by performing evaporation at 80° C. to obtain a mold.

Liquid PDMS (weight ratio of prepolymer and crosslinking agent of 10:1) was poured onto the mold and cured at 80° C. for 3 hours. Then, NOA 61 was poured onto the cured polymer pattern layer and the NOA 61 prepolymer was degassed in order to overcome capillary forces. Uncured NOA 61 on the polymer pattern layer was exposed to UV at 132 mW/cm 2 for 20 minutes, and then peeled off from the polymer pattern layer and washed with toluene. A 2% by weight OTS solution in toluene was spin-coated onto an oxygen plasma-treated NOA 61 stamp and a multi-use stamp was manufactured.

Manufacture of Stretchable ACF

An 8% by weight solution of SEBS-g-MA in chloroform was spin-coated on a PDMS film at 3,000 rpm for 60 and the solvent was evaporated at 80° C. for 10 minutes. After separating the SEBS-g-MA thin film (thickness of up to 17 µm) on the PDMS film, it was positioned on an OTS-treated slide glass and thermally compressed at 180° C. for 10 minutes in a vacuum state using the multi-use stamp manufactured above to manufacture a patterned polymer film.

Then, Au/Ni/PS microparticles (up to 20 µm in diameter) were rubbed with a small piece of PDMS on the patterned polymer film, and the patterned polymer film in which the conductive particles were aligned was interposed between PDMS and slide glass and thermally compressed at 235° C. for 2 hours in a vacuum state to obtain a stretchable ACF (thickness of up to 13 µm) containing modified MPs.

Example 2

A stretchable ACF was obtained in the same manner as in Example 1 except that the patterned polymer film in which the conductive particles were aligned was interposed between PDMS and slide glass and thermally compressed at 180° C. for 2 hours in a vacuum state.

Example 3

A stretchable ACF was obtained in the same manner as in Example 1 except that the patterned polymer film in which the conductive particles were aligned was interposed between PDMS and slide glass and thermally compressed at 130° C. for 2 hours in a vacuum state.

Example 4

A stretchable ACF was obtained in the same manner as in Example 1 except that a 6% by weight solution of SEBS-g-MA in chloroform was used.

Example 5

A stretchable ACF was obtained in the same manner as in Example 1 except that a 12% by weight solution of SEBS-g-MA in chloroform was used.

Reference Example 1

An 8% by weight solution of SEBS-g-MA in chloroform was spin-coated on the PDMS film at 3,000 rpm for 60 and the solvent was evaporated at 80° C. for 10 minutes. A polymer film was manufactured by separating the SEBS-g-MA thin film (thickness of up to 17 µm) from the PDMS film.

Reference Example 2

The patterned polymer film in which the conductive particles were aligned, which was manufactured in Example 1, was prepared as a state in which a separate thermocompression process was not performed.

Experimental Example 1: Observation of SEM Images and OM Images

In Example 1, an SEM image was taken of the cross section of the patterned polymer film in which the conductive particles were aligned using a FE-SEM (S-2400, Hitachi) device under conditions of 25 kV and 1.2 k magnification.

Figure 5:
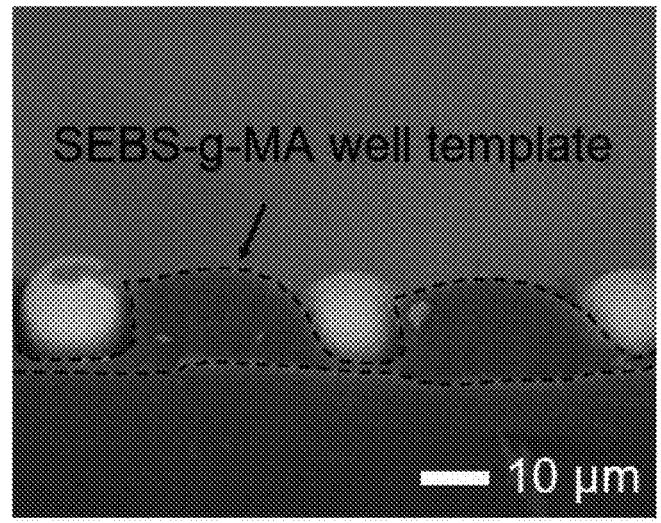
FIG. 5 is an SEM image of a cross section of a patterned polymer film in which conductive particles of Example 1 are aligned.

FIG. 5 shows an SEM image of a cross section of a patterned polymer film in which conductive particles of Example 1 are aligned.

Referring to FIG. 5, it may be confirmed that the polymer film is patterned into a pattern including a concave portion and a convex portion, and it may be confirmed that conductive particles are disposed and aligned in the concave portion of the pattern.

In addition, an SEM image was taken of the cross section of the stretchable ACF manufactured in Example 1 using the same device and using an FE-SEM (S-2400, Hitachi) device under conditions of 25 kV and 1.5 k magnification.

Figure 6:
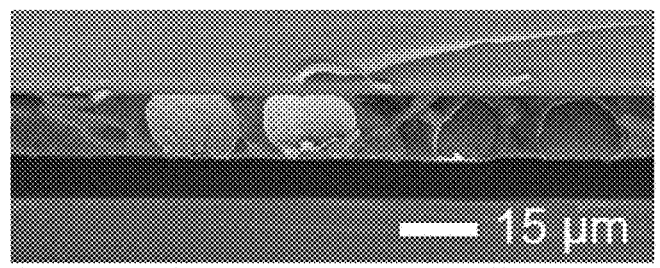
FIG. 6 is an SEM image of a cross section of a stretchable ACF manufactured in Example 1.

FIG. 6 shows an SEM image of a cross section of a stretchable ACF manufactured in Example 1.

Referring to FIG. 6, conductive particles included in the polymer film may be confirmed, and it may be confirmed that the conductive particles are deformed by thermocompression from the spherical shape observed in FIG. 5 to a shape in which the top and bottom are exposed.

An optical microscope (OM) image was taken of the surface of the stretchable ACF manufactured in Example 1 using an Olympus BX-51 under conditions of a reflection mode and 200 magnification, the stretchable ACF manufactured in Example 1 was uniaxially stretched in the 100% transverse direction, and then an OM image of the surface was taken under the same conditions as above.

Figure 7A:
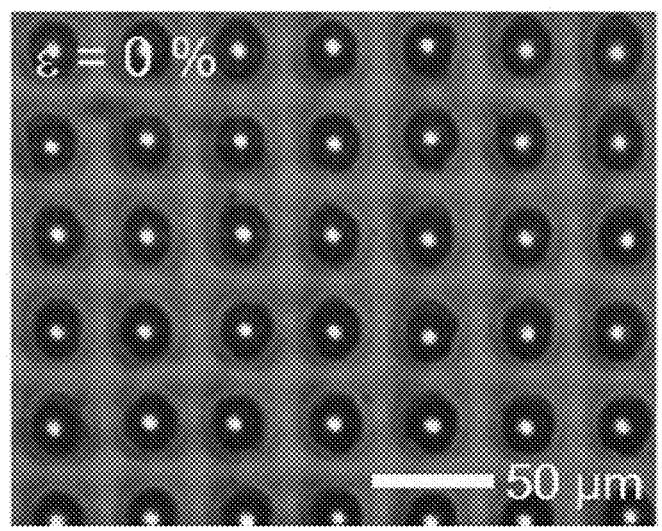
FIGS. 7A and 7B are OM images of the surface of the stretchable ACF manufactured in Example 1, respectively.
Figure 7B:
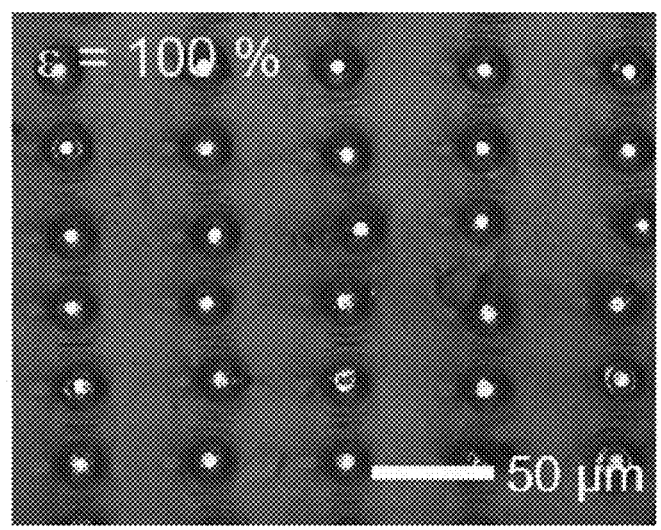

FIGS. 7A and 7B show OM images of the surface of the stretchable ACF manufactured in Example 1, respectively.

Referring to FIGS. 7A and 7B, it may be confirmed that the polymer film is not destroyed or the particles are not dropped even with the stretching stimulus in the stretchable ACF manufactured in Example iso that the structural stability is excellent and durability is secured.

Experimental Example 2: Mechanical Properties of Stretchable ACF

The stretchable ACFs of Examples 1 to 3 and the films of Reference Examples 1 and 2 were cut to a size of 5 mm×30 mm, and both surfaces thereof were fixed to a tensioner with polyimide pressure-sensitive adhesive tape. Stress-strain curves were obtained using a tensioner (T95-PE, LINKAM SCIENTIFIC INSTRUMENTS LTD, UK) under the following conditions: the tensioned ACP had a thickness of 13 μm and a size of 5 mm*5 mm. The tensile speed was 50 μm/s and the initial distance was 5 mm.

Figure 8:
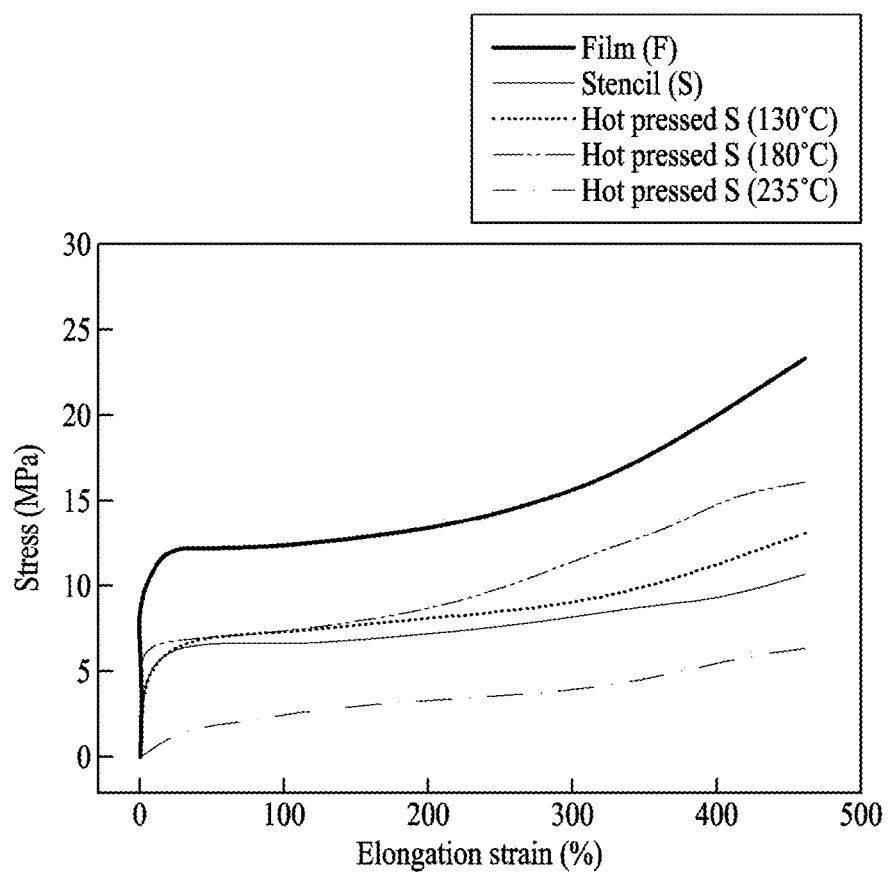
FIG. 8 is stress-strain curves of the stretchable ACFs of Examples 1 to 3 and the films of Reference Examples 1 and 2.

FIG. 8 shows stress-strain curves of the stretchable ACFs of Examples 1 to 3 and the films of Reference Examples 1 and 2.

Referring to FIG. 8, it may be confirmed that the stretchable ACFs of Examples 1 to 3 have excellent stretchability, thereby having a stress of less than 10 MPa under an elongation of 100%. In particular, it may be confirmed that the stretchable ACF of Example 1 manufactured by being thermally compressed at the highest temperature has the lowest stress and thus has excellent elasticity.

Experimental Example 3: Measurement of Connection Resistance and Alignment Maintenance Degree For the 4-probe measurement method, a gold circuit line with a width of 1 mm and a thickness of 60 nm was manufactured with a thermal evaporator (TERALEADER Co. LTD., Korea) using a PET shadow mask on an MPTMPS-treated PI film. The ACFs manufactured in Examples 1, 4, and 5 were laminated on the manufactured gold circuit line and 4-probe measurement was performed using Keithley 2450. As a result of the measurement, connection resistance was derived. In addition, the connection resistance was measured under the same conditions by directly connecting them using liquid metal (ref).

In addition, the number of particles before and after thermocompression of the ACFs manufactured in Examples 1, 4, and 5 was observed through an optical microscope, and the alignment maintenance degree was calculated according to the above-described Equation #.

Figure 9:
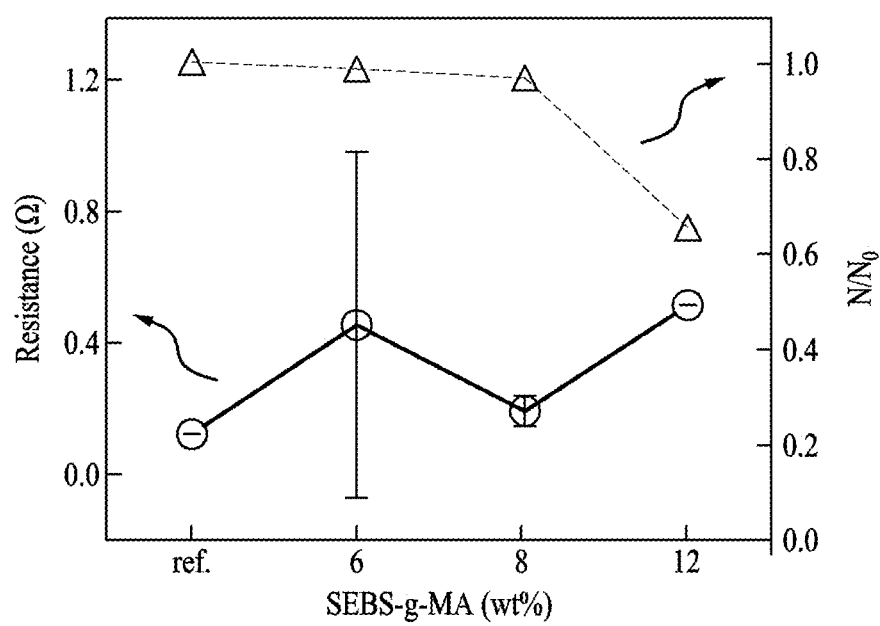
FIG. 9 is a graph of connection resistance and alignment maintenance degree of ACFs manufactured in Examples 1, 4, and 5.

FIG. 9 shows a graph of connection resistance and alignment maintenance degree of ACFs manufactured in Examples 1, 4, and 5.

Referring to FIG. 9, it may be confirmed that the stretchable ACF manufactured in Example 1 has excellent effects due to high alignment maintenance degree while having low connection resistance. In addition, due to the low content of the polymer in the case of the stretchable ACF manufactured in Example 4, it may be confirmed that the scale bar is displayed in a rather wide range since the connection resistance is not constant due to a mixture of a mixture of a region with a large area where conductive particles are exposed and a region with a small area where the conductive particles are exposed during the thermocompression process.

Experimental Example 4: Surface Observation of ACF According to Polymer Content

OM images were taken on the surfaces of the stretchable ACFs manufactured in Examples 1, 4, and 5 using an Olympus BX-51 under conditions of a reflection mode and 50 magnification.

Figure 10A:
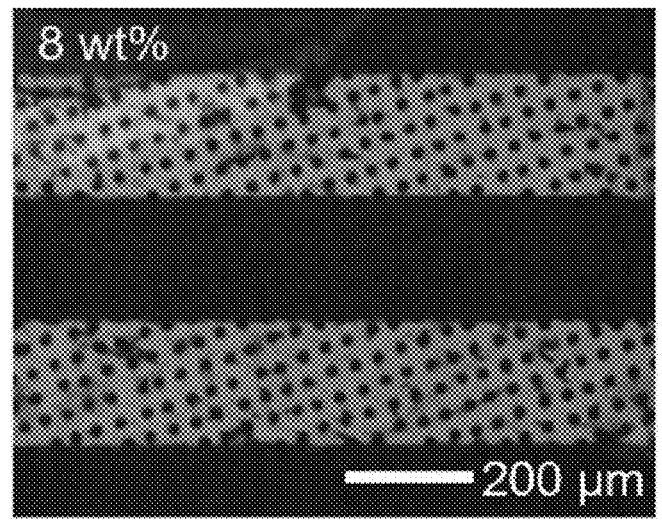
FIGS. 10A to 10C are surface OM images of stretchable ACFs manufactured in Examples 1, 4, and 5, respectively.
Figure 10B:
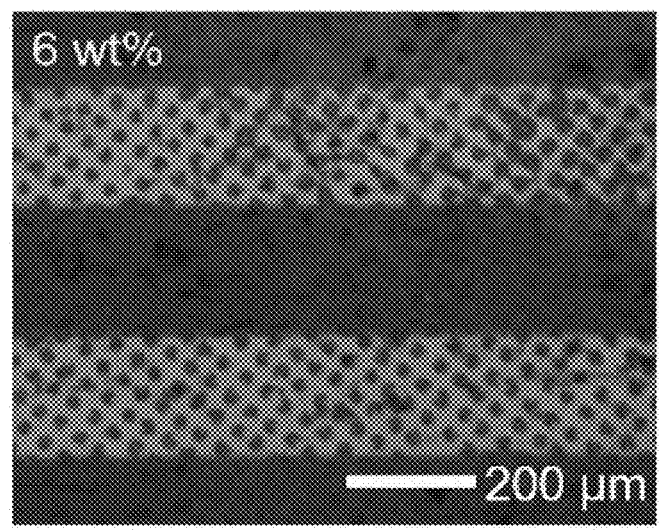
Figure 10C:
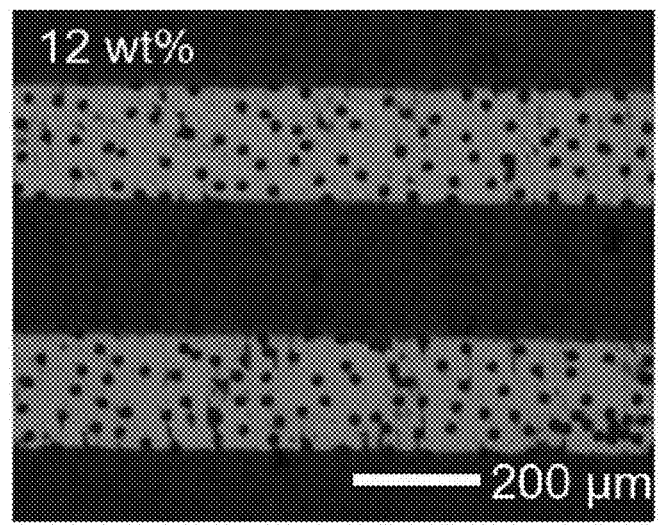

FIGS. 10A to 10C show surface OM images of stretchable ACFs manufactured in Examples 1, 4, and 5, respectively.

Referring to FIGS. 10A to 10C, it may be confirmed that the conductive particles are most uniformly arranged in the stretchable ACF manufactured in Example 1.

Combining Experimental Examples 3 and 4 above, it may be seen that the stretchable ACF of Example 1 having a polymer content of 8% by weight is preferable since the conductive particles are uniformly arranged and the connection resistance is low.

Experimental Example 5: Evaluation of Electrical Properties of Stretchable ACF

After covering the SUS shadow mask on the polyimide film, wiring 1 and wiring 2 on which a gold line with a width of 100 μm was deposited with an evaporator were manufactured, and then lamination was performed so as to position the stretchable ACF manufactured in Example 1 between wiring 1 and wiring 2, thermocompression was performed at a temperature of 230° C. for 1 to 2 hours to manufacture a laminate, and the surface of the manufactured laminate was taken as an OM image using Olympus BX-51 under conditions of a reflection mode and 50 magnification.

Figure 11:
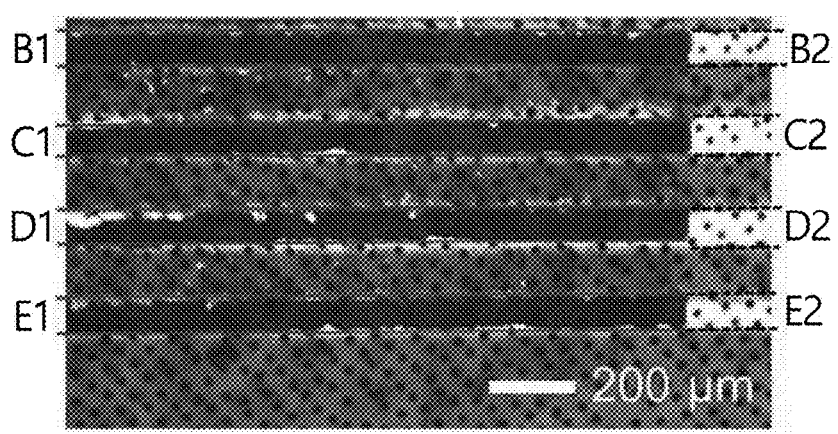
FIG. 11 is an OM image taken from the top surface of a laminate including the stretchable ACF manufactured in Example 1.

FIG. 11 shows an OM image taken from the top surface of a laminate including the stretchable ACF manufactured in Example 1.

Referring to FIG. 11, a form in which the stretchable ACF (a part where conductive particles are aligned) is located between wiring 1 (deep pink solid line part) and wiring 2 (black dotted line part) may be confirmed. In addition, gold lines of wiring 1 and wiring 2 connected through the stretchable ACF are shown (A1-A2 (not shown), B1-B2, C1-C2, D1-D2, and E1-E2).

In the above-described manufactured laminate, a value of flowing current was measured with Keithley 2400 by applying a bias of 0 to 1.5 V between the metal lines of wiring 1 and wiring 2.

Figure 12:
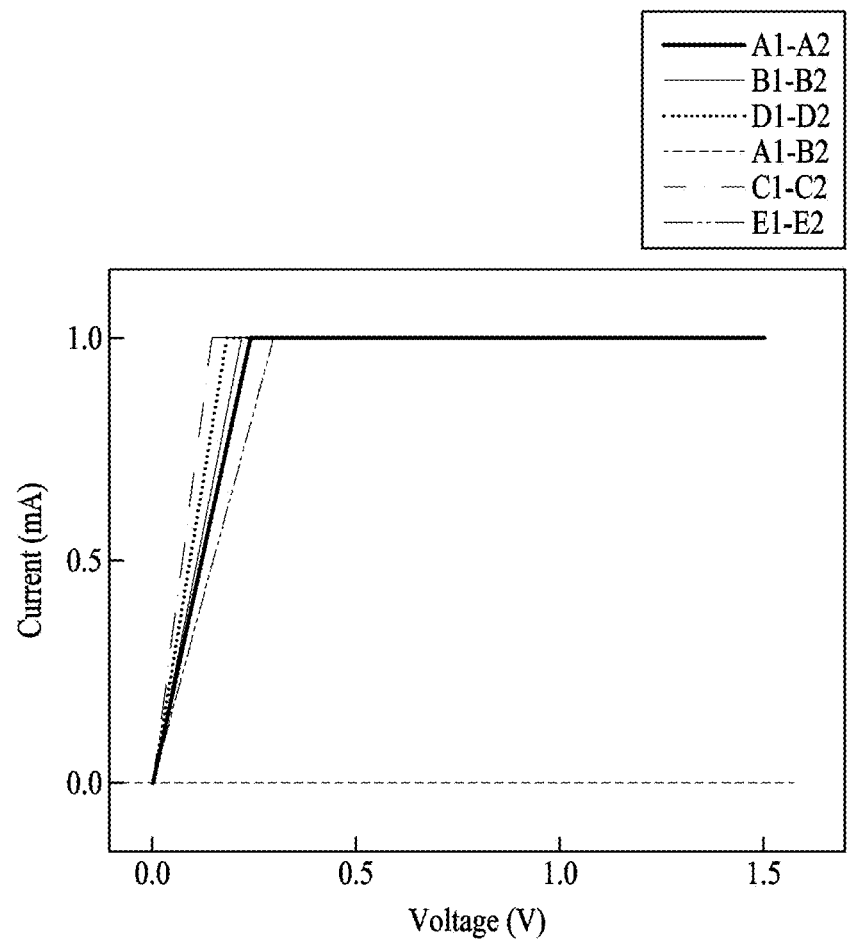
FIG. 12 is a result of testing the electrical performance of a laminate of Experimental Example 5.

FIG. 12 shows a graph of the result of testing the electrical performance of a laminate of Experimental Example 5. Specifically, a graph of the current value with respect to the bias of the laminate is shown for each connection line.

In the case of the connection lines (A1-A2, B1-B2, C1-C2, D1-D2, and E1-E2) of the laminated wiring 1 and wiring 2, it was confirmed that high conductivity connection was possible through the ACF, and it was confirmed that the current was not measured in the separated A1-B2 line. As a result, it may be confirmed that perfect anisotropic conduction is achieved through the fabricated ACF.

Manufacturing Example 1

A polyimide film washed with acetone, ethanol, and deionized water was oxygen plasma-treated, and a (3-mercaptopropyl)trimethoxysilane solution was subjected to vapor deposition for 2 hours in a vacuum state to deposit target molecules. A surface-treated substrate was manufactured by rinsing the self-assembled membrane (SAM)-treated substrate and drying it at 80° C.

Manufacturing Example 2

A surface-treated substrate was manufactured in the same manner as in Manufacturing Example 1 except that a (3-aminopropyl)triethoxysilane solution was used.

Manufacturing Example 3

A surface-treated substrate was manufactured in the same manner as in Manufacturing Example 1 except that a (3-glycidyloxypropyl)triethoxysilane solution was used.

Example 6

A laminate was manufactured by interposing the stretchable ACF manufactured in Example 1 between two sheets of the surface-treated substrate manufactured in Manufacturing Example 1 so that it is in contact with the surface-treated surfaces thereof, and performing thermocompression for 1 hour.

Example 7

The stretchable ACF manufactured in Example 1 was interposed between two sheets of the surface-treated substrate manufactured in Manufacturing Example 2 above so as to come into contact with the surface-treated surfaces thereof, and thermally compressed for 1 hour to manufacture a laminate.

Example 8

The stretchable ACF manufactured in Example 1 was interposed between two sheets of the surface-treated substrate manufactured in Manufacturing Example 3 above so as to come into contact with the surface-treated surfaces thereof, and thermally compressed for 1 hour to manufacture a laminate.

Reference Example 3

The purchased and prepared double-sided tape (TT044) for wig bonding of 3M company was interposed between two sheets of the surface-treated substrate manufactured in Manufacturing Example 3 above so as to come into contact with the surface-treated surfaces thereof, and thermally compressed for 1 hour to manufacture a laminate.

Reference Example 4

The purchased and prepared polystyrene-block-poly(ethylene-random-butyrene)-block-polystyrene film of Sigma-Aldrich Corporation was interposed between two sheets of the surface-treated substrate manufactured in Manufacturing Example 3 above so as to come into contact with the surface-treated surfaces thereof, and thermally compressed for 1 hour to manufacture a laminate.

Experimental Example 6: Confirmation of Bonding Characteristics

While separating the two substrates of the laminates manufactured in Examples 6 to 8 and Reference Examples 3 and 4 by the T-peel off test, adhesive forces were measured when the distance between the substrates was 1 cm.

Figure 13:
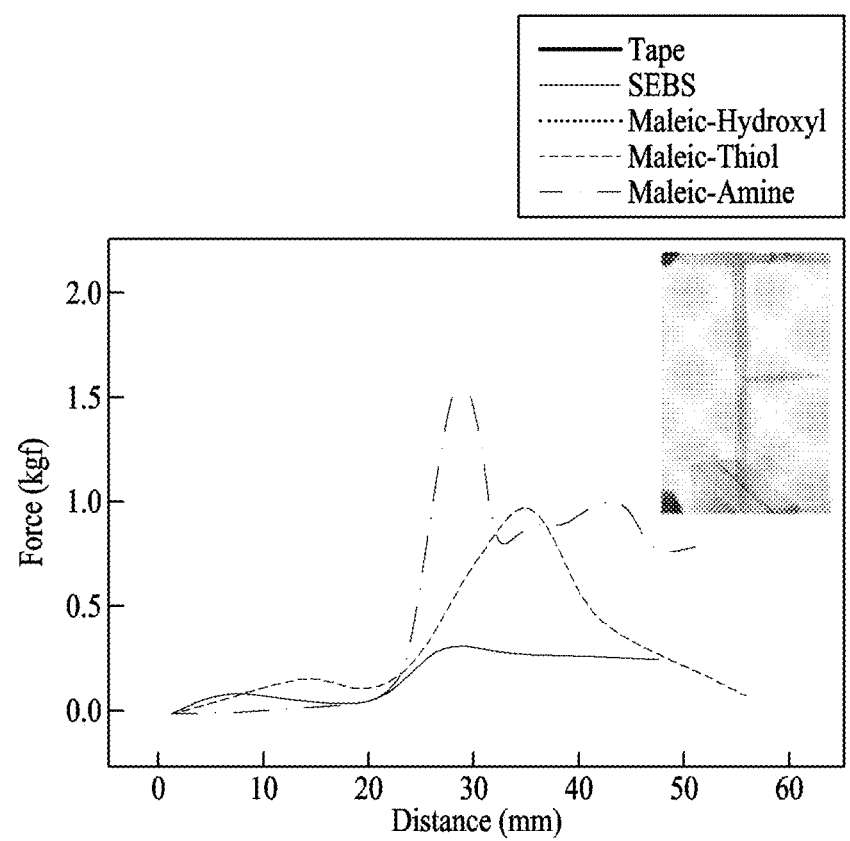
FIG. 13 is a graph of adhesive forces according to distances of laminates manufactured in Examples 6 to 8 and Reference Examples 3 and 4.

FIG. 13 shows a graph of adhesive forces according to distances of laminates manufactured in Examples 6 to 8 and Reference Examples 3 and 4.

Referring to FIG. 13, it may be confirmed that the laminate of Example 7 has the strongest adhesive force, and the laminate of Example 6 has the secondly strongest adhesive force. That is, when the surface of the substrate is surface-treated with silane having a hydrophilic group, it may be confirmed that the strong bonding force is obtained.

Manufacturing Example 4

A gold line with a width of 200 µm and a thickness of 60 nm was formed on a polyimide film washed with acetone, ethanol, and deionized water with a thermal evaporator through a SUS shadow mask, and a (3-aminopropyl)triethoxysilane solution was subjected to vapor deposition for 2 hours in a vacuum state to deposit target molecules. A surface-treated electrode including a flexible substrate was manufactured by rinsing the self-assembled membrane (SAM)-treated substrate and drying it at 80° C.

Manufacturing Example 5

An EGaIn liquid metal line with a width of 200 µm was fabricated to be embedded on the PDMS film, and the surface on which the liquid metal line was formed was oxygen plasma-treated to manufacture an electrode including a stretchable substrate.

Example 9

The stretchable ACF manufactured in Example 1 was interposed between the two electrodes manufactured in Manufacturing Example 4 so as to come into contact with the surfaces thereof on which the gold line was formed, and thermally compressed at a temperature of 80° C. for 1 hour to manufacture a laminate with a size of 5 mm*10 mm.

Example 10

The stretchable ACF manufactured in Example 1 was interposed between the electrode manufactured in Manufacturing Example 4 and the electrode prepared in Manufacturing Example 5 so as to come into contact with the surface thereof on which the gold line of the electrode was formed and the surface thereof on which the metal line was formed, and thermally compressed at a temperature of 80° C. for 1 hour to manufacture a laminate with a size of 5 mm*10 mm.

Example 11

The stretchable ACF manufactured in Example 1 was interposed between the two electrodes manufactured in Manufacturing Example 5 so as to come into contact with the surfaces thereof on which the gold line was formed, and thermally compressed at a temperature of 80° C. for 1 hour to manufacture a laminate with a size of 5 mm*10 mm.

Experimental Example 7: Confirmation of Electrical Properties for Various Substrates Current values obtained when 1 V was applied to the laminate of Example 9 with Keitheley 2400 while applying different pressures over time were measured.

Current values obtained when 1 V was applied thereto with Keitheley 2400 while stretching the laminates of Examples 10 and 11 in one direction at different elongations over time were measured.

The measured current was expressed as a relative current by dividing it by the current value (I0) when no pressure was applied or no stretching was performed.

Figure 14:
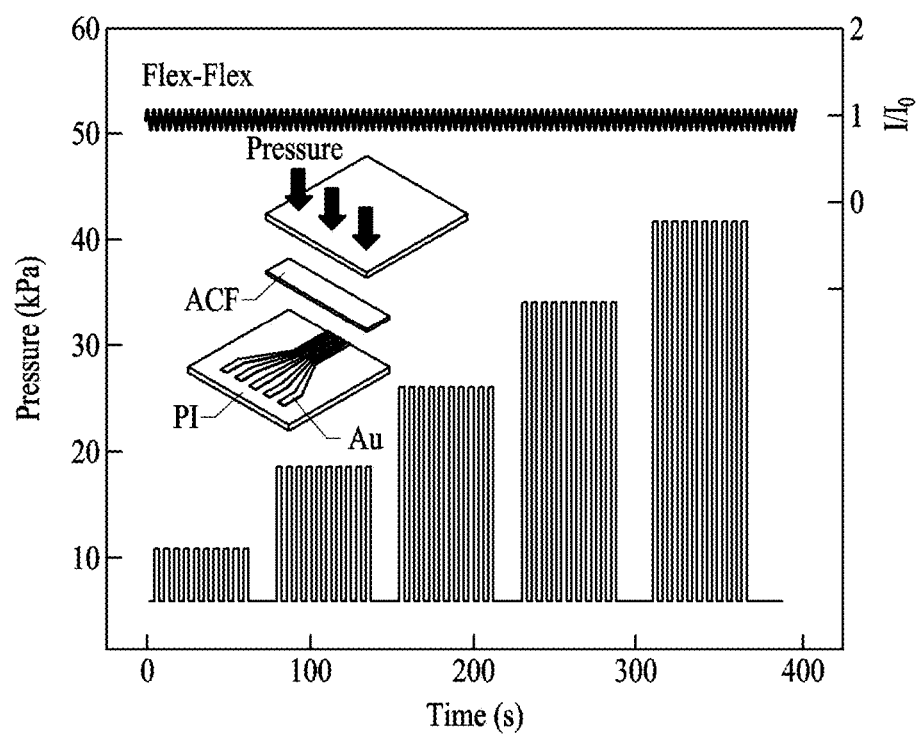
FIG. 14 is a graph showing pressure and relative current over time applied to a laminate of Example 9.
Figure 15:
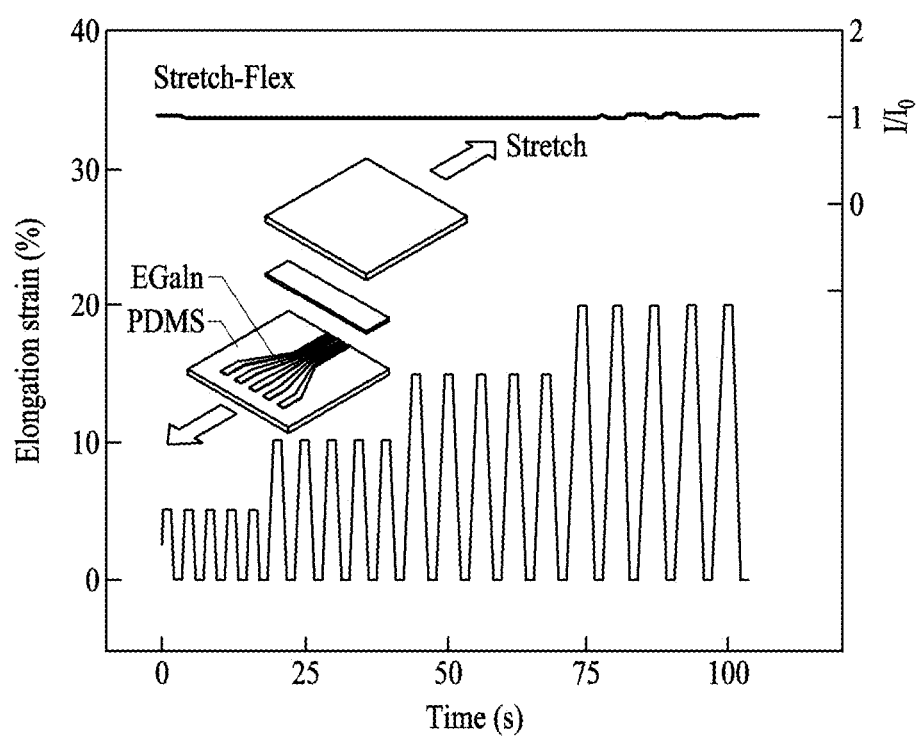
FIGS. 15 and 16 are graphs showing elongations and relative currents over time applied to laminates of Examples 10 and 11, respectively.
Figure 16:
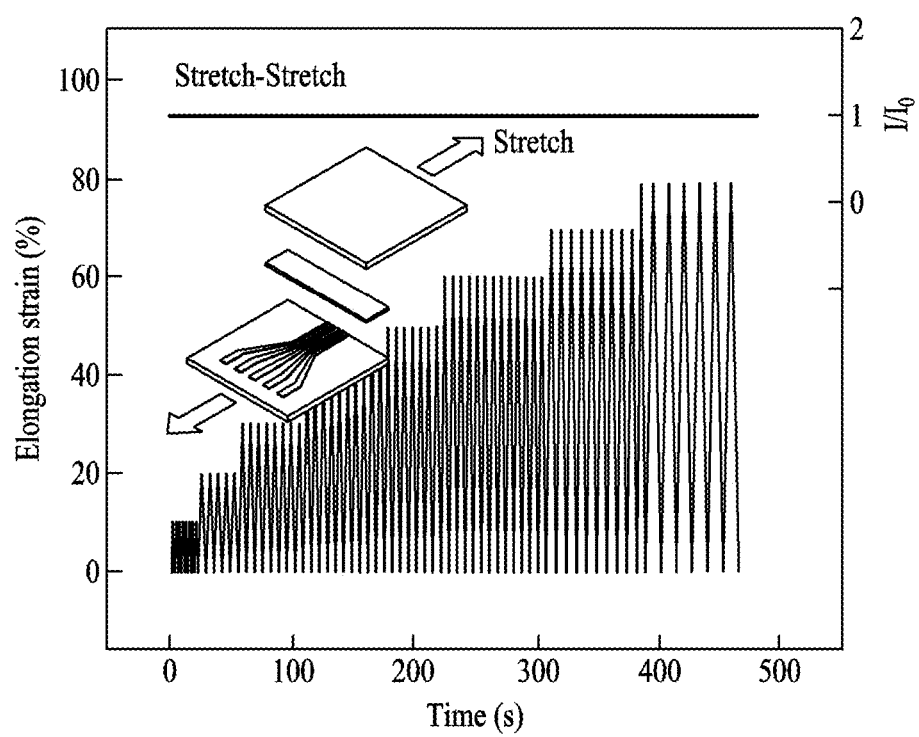

FIG. 14 is a graph showing pressure and relative current over time applied to a laminate of Example 9, and FIGS. 15 and 16 are graphs showing elongations and relative currents over time applied to laminates of Examples 10 and 11, respectively.

Referring to FIG. 14, it may be seen that a stable interfacial connection is made even in the presence of external pressure by chemically bonding the maleic acid group included in the polymer film of the stretchable ACF manufactured in Example 1 and the amine group on the surface of the flexible substrate, referring to FIG. 15, it may be seen that a stable interfacial connection is made even if the elongation according to external force is applied up to 20% by chemically bonding the maleic acid group included in the polymer film of the stretchable ACF manufactured in Example 1, the amine group on the surface of the flexible substrate, and the hydroxy group on the surface of the stretchable substrate, and referring to FIG. 16, it may be seen that a stable interfacial connection is made since there is little change in the current even if the elongation according to external force is applied up to 80% by chemically bonding the maleic acid group included in the polymer film of the stretchable ACF manufactured in Example 1 and the hydroxy group on the surface of the stretchable substrate.

Hereinabove, although the present disclosure has been described by limited examples, the present disclosure is not limited thereto, and it is no doubt that various modifications and variations may be made by one of ordinary skill in the art to which the present disclosure pertains within the technical spirit of the present disclosure and the equivalent scope of the following claims.

The invention claimed is:

1. A stretchable anisotropic conductive film (ACF) comprising:
a polymer film; and
conductive particles inserted and aligned in the polymer film,
wherein the conductive particles are exposed to an outside of top and bottom surfaces of the polymer film, and 10% to 30% of an outer surface of the conductive particles is exposed to the outside of the polymer film, the stretchable ACF has an alignment maintenance degree of 0.8 to 1.0, and the alignment maintenance degree is expressed by the following equation:

$$\text{alignment maintenance degree} = N/N_0,$$

wherein, N denotes the number of conductive particles per unit area after a secondary thermocompression, and $N_0$ denotes the number of conductive particles per unit area before the secondary thermocompression.

2. The stretchable ACF of claim 1, wherein the polymer film comprises maleic anhydride-grafted thermoplastic rubber.

3. The stretchable ACF of claim 2, wherein the thermoplastic rubber is selected from styrene-ethylene-butylene-styrene (SEBS), styrene-isoprene-styrene (SIS), styrene-butadiene-styrene (SBS), polyurethane (PU)-based rubber, and polyolefin (PO)-based rubber.

4. The stretchable ACF of claim 1, wherein a distance between the conductive particles is from 10 μm to 400 μm.

5. The stretchable ACF of claim 1, wherein the conductive particles are aligned in any one of lattice-shaped, honeycomb-shaped, linear, and quadrangular arrangement forms.

6. The stretchable ACF of claim 1, wherein the stretchable ACF has a stress of 10 MPa or less when stretched to an elongation of 100%.

7. A method of manufacturing the stretchable anisotropic conductive film (ACF) according to claim 1, the method comprising:
manufacturing a polymer film patterned in a pattern comprising a convex portion and a concave portion;
disposing conductive particles in the concave portion of the patterned polymer film to obtain a polymer film in which the conductive particles are aligned; and
thermally compressing the polymer film in which the conductive particles are aligned.

8. The method of claim 7, wherein the manufacturing of the patterned polymer film comprises:
manufacturing a multi-use stamp; and
thermally compressing the multi-use stamp with the polymer film to manufacture a polymer film patterned in a pattern comprising a convex portion and a concave portion.

9. The method of claim 8, wherein the manufacturing of the multi-use stamp comprises:
forming a photoresist layer by coating and curing a photoresist on a substrate;
positioning a photomask on the photoresist layer and irradiating light to form a patterned photoresist layer; and
manufacturing a mold by additionally curing the patterned photoresist layer and immersing it in a developing solution; and
manufacturing a multi-use stamp containing a pattern comprising a convex portion and a concave portion using the mold.

10. The method of claim 8, wherein the polymer film is manufactured by coating maleic anhydride-grafted thermoplastic rubber with a solution containing 5% by weight to 20% by weight and drying it.

11. The method of claim 8, wherein the concave portion of the patterned polymer film is formed by a convex portion of the multi-use stamp, and the convex portion of the patterned polymer film is formed by a concave portion of the multi-use stamp.

12. The method of claim 7, wherein the disposing of the conductive particles comprises:
    positioning a plurality of conductive particles on a portion or the entirety of the patterned polymer film;
    positioning an elastic member on the conductive particles at a separation distance of 1 to 10 times the diameter of the conductive particles from the patterned polymer film; and
    reciprocating the patterned polymer film once or a plurality of times in one direction by a predetermined distance so that the elastic member inserts the conductive particles into the concave portion of the patterned polymer film.

13. The method of claim 7, further comprising surface-treating one surface or both surfaces of the stretchable ACF with oxygen plasma after the performing the secondary thermocompression.

14. A device comprising one or more of an electrode and an electronic component, and an interfacial bonding member comprising the stretchable ACF according to claim 1.

15. The device of claim 14, wherein one or more of the electrode and the electronic component has a surface which is in contact with the interfacial bonding member and on which a hydrophilic surface treatment is performed.

16. The device of claim 15, wherein the hydrophilic surface treatment is an oxygen plasma treatment.

17. The device of claim 15, wherein a silane compound is used in the hydrophilic surface treatment.

18. The device of claim 17, wherein the silane compound comprises one or more of a thiol group, an amine group, a glycidyl group, a hydroxyl group, a carboxyl group, a vinyl group, a phosphonate group, an anhydride group, a (meth)acrylate group, an isocyanate group, an aldehyde group, a cyano group, an azide group, an ester group, and a halogen substituent.

19. The device of claim 14, wherein the electronic component comprises one or more of an active element and a passive element.

* * * * *